United States Patent [19]

Mita

[11] Patent Number: 4,737,723
[45] Date of Patent: Apr. 12, 1988

[54] DROP-OUT DETECTION CIRCUIT

[75] Inventor: Rikitaroh Mita, Kanagawa, Japan

[73] Assignee: Canon Kabushiki Kaisha, Tokyo, Japan

[21] Appl. No.: 866,329

[22] Filed: May 22, 1986

[30] Foreign Application Priority Data

May 27, 1985 [JP] Japan .................. 60-112230

[51] Int. Cl.⁴ .................. H03K 5/19; H04N 17/00
[52] U.S. Cl. .................. 328/120; 307/518; 358/139; 358/336; 360/38.1
[58] Field of Search .................. 328/120; 307/518; 358/139, 167, 314, 336; 360/38.1

[56] References Cited

U.S. PATENT DOCUMENTS

| | | | |
|---|---|---|---|
| 4,158,855 | 6/1979 | Thomas et al. | 358/336 |
| 4,353,091 | 10/1982 | Hoppe | 328/120 |
| 4,467,285 | 8/1984 | Rinaldi | 307/518 |
| 4,477,842 | 10/1984 | Kaneko | 360/38.1 |

Primary Examiner—John S. Heyman
Attorney, Agent, or Firm—Toren, McGeady & Associates

[57] ABSTRACT

The drop-out detection circuit includes basically an oscillator arranged to generate a clock signal of a predetermined frequency; a first flip-flop arranged to have the output signal thereof inverted by the clock signal and to be reset by a binary signal to be detected; and a second flip-flop arranged to sample and hold the output signal of the first flip-flop according to the clock signal.

18 Claims, 2 Drawing Sheets

DROP-OUT DETECTION CIRCUIT

BACKGROUND OF THE INVENTION

1. Field of the Invention

This invention relates to a drop-out detection circuit, and more particularly, to a circuit highly suited for detecting drop-out of angle modulated signals.

2. Description of the Related Art

In reproducing from a recording medium such signals as video signals with a reproducing apparatus, some parts of the signals often drop out due to various causes. The apparatus of this kind is, therefore, generally provided with some arrangement to compensate for such signal drop-out.

To have signal drop-out adequately compensated for, it is necessary to accurately detect the drop-out. There have been proposed various drop-out detecting methods. FIG. 1 of the accompanying drawings shows an example of the conventional drop-out detection circuit adapted for detecting the drop-out of frequency modulated signals in particular. Referring to FIG. 1, an input terminal 31 receives, for example, a frequency modulated luminance signal S-31 which is as shown at a part S-31 in FIG. 2. The signal S-31 is amplified by the amplifier 32 and then is changed into a signal of a given level by a limiter 33 as shown at a part S-32, in FIG. 2. The signal S-32 which is produced from the limiter 33, is applied to a fall synchronizing type retriggerable monostable multivibrator (hereinafter referred to as monostable multivibrator) 34. With the time constant T of the monostable multivibrator 34 set at a given value by a resistor 34a and a capacitor 34b, the output level of the monostable multivibrator 34 becomes low in the event of a long drop-out exceeding the time constant T, as shown at a part S-33 in FIG. 2. Then, the output S-33 of the monostable multivibrator 34 is obtained from an output terminal 35 as a drop-out detection signal.

However, in cases where a signal of a broad band is to be processed with the conventional device of the above-stated kind, by arranging to make the device capable of detecting also a very short drop-out such as 1 to 2 μs, for example, the operation of the device becomes extremely unstable. In that instance, the device often fails to perfectly follow the drop-out occurring for such a short period of time. In the case of the device arranged in the manner as mentioned above, the device may be enabled to detect such a short drop-out by arranging the monostable multivibrator 34 to have an extremely small time constant T. However, an unstable operation generally results from making the time constant of a monostable multivibrator extremely small and thus prevents the monostable multivibrator from accurately following a trigger signal.

Further, in the case of such a short period of time, it is also difficult to select and accurately adjust the time constant set by a capacitor and a resistor. Besides, since the device is provided with a capacitor, its operation tends to become unstable due to changes in temperature. It has been another problem that the conventional device does not readily permit use of an IC.

SUMMARY OF THE INVENTION

In view of the problems of the prior art mentioned above, it is a general object of this invention to provide a drop-out detection circuit which is capable of accurately operating.

It is a more specific object of this invention to provide a drop-out detection circuit which is capable of accurately carrying out drop-out detection even in the event of detecting a drop-out occurring only for a very short period of time.

Under this object, a drop-out detection circuit embodying this invention comprises: means for binary coding the level of a signal to be detected; means for generating a clock signal of a given frequency; means for detecting that the binary coded signal comes to assume a predetermined state within each period of the clock signal; and means for generating a drop-out detection signal on the basis of a signal produced from the detecting means.

It is another specific object of this invention to provide a drop-out detection circuit which is suited for use of an IC.

Under that object, a drop-out detection circuit embodying this invention comprises: an oscillator arranged to generate a clock signal of a predetermined frequency; a first flip-flop arranged to have the output signal thereof inverted by the clock signal and to be reset by a binary signal to be detected; and a second flip-flop arranged to sample and hold the output signal of the first flip-flop according to the clock signal.

These and further objects and features of this invention will become apparent from the following detailed description of the preferred embodiment thereof taken in connection with the accompanying drawings.

DETAILED DESCRIPTION OF THE PREFERRED EMBODIMENT

Figure 1:
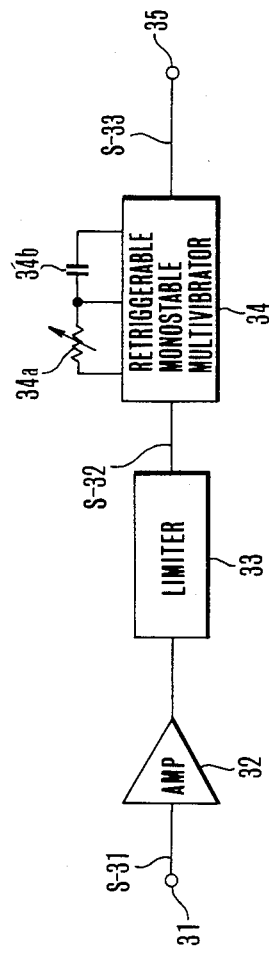
FIG. 1 is a circuit diagram showing an example of the conventional drop-out detection circuit.
Figure 3:
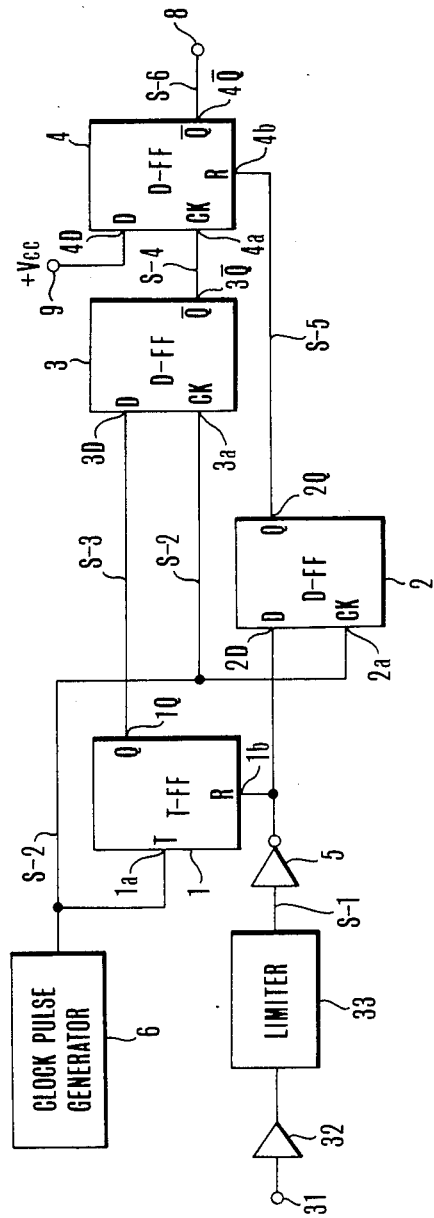
FIG. 3 is a circuit diagram showing the arrangement of a drop-out detection circuit embodying this invention.
Figure 2:
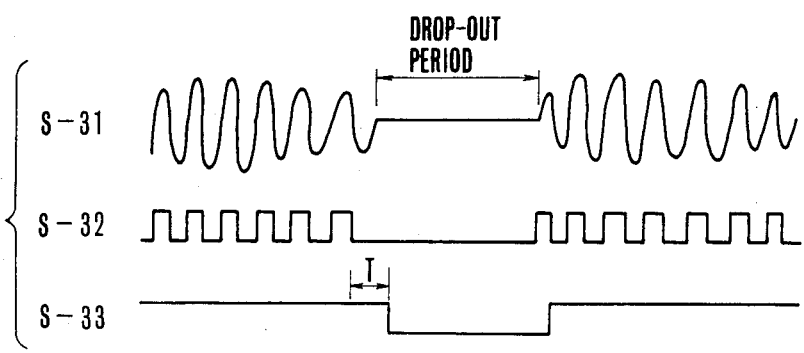
FIG. 2 is a timing chart showing the operation of the circuit shown in FIG. 1.
Figure 4:
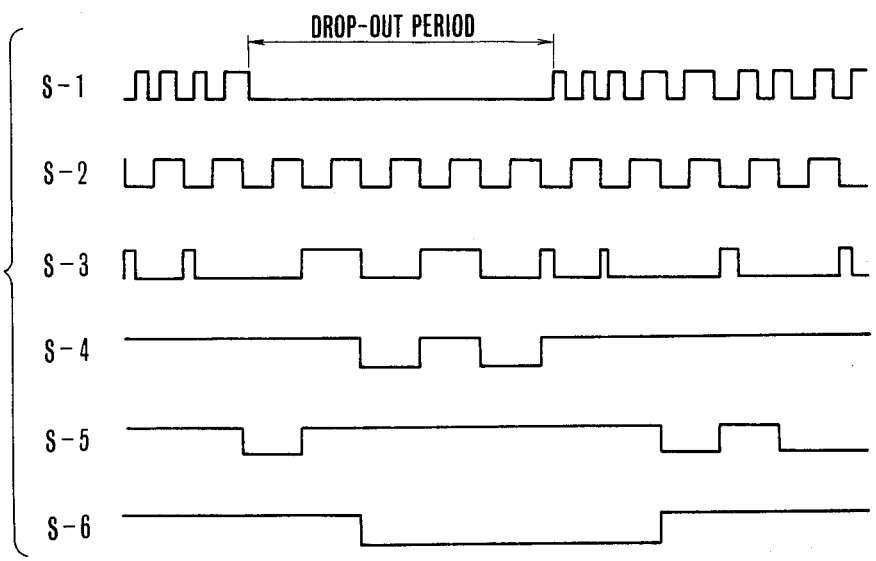
FIG. 4 is a timing chart showing the operation of the circuit shown in FIG. 3.

An embodiment of this invention is arranged as shown in FIG. 3 and operates as shown in FIG. 4. In FIG. 3, component elements of the drop-out detection circuit which are similar to those shown in FIG. 1 are indicated by the same reference numerals and the details of them are omitted from the following description:

Referring to FIG. 3, the illustration includes a T type flip-flop 1 (hereinafter referred to as T-FF) which has a reset terminal; D type flip-flops (hereinafter referred to as D-FF's) 2 and 3; a D-FF 4 which has a reset input terminal; an inverter 5 arranged to receive a signal S-1 which is obtained with the waveform of a frequency modulated signal shaped through a limiter 33; a clock pulse generator 6 arranged to generate a clock signal S-2 which has a predetermined period; an output terminal 8; and a terminal 9 which is arranged to receive a power supply voltage Vcc. In this specific embodiment, all the flip-flops 1, 2, 3 and 4 are of the type arranged to be triggered in synchronism with the fall of a clock pulse signal and to be reset when a low level input is applied to the reset input terminal thereof. The inverter 5 receives the signal S-1 which remains at a low level during a drop-out period as shown in FIG. 4.

With the drop-out detection device arranged according to this invention as described above, it operates as follows: When a clock signal S-2 shown in FIG. 4 is supplied to a clock input terminal 1a of the T-FF 1 and a signal obtained by inverting an incoming signal S-1, which is as shown in FIG. 4, is supplied to a reset input terminal 1b of the T-FF 1, the T-FF 1 produces from its output terminal 1Q a signal S-3 as shown in FIG. 4. The output signal S-3 of the T-FF 1 is supplied to an input terminal 3D of the D-FF 3. The clock signal S-2 is supplied to a clock input terminal 3a of the D-FF 3. The D-FF 3 then produces from its output terminal 3Q, a signal S-4 as shown in FIG. 4. The D-FF 2 is arranged to have the incoming signal S-1, which is inverted by the inverter 5, supplied to an input terminal 2D thereof and to have also the clock signal S-2 supplied to a clock input terminal 2a thereof. The D-FF 2 produces from its output terminal 2Q, a signal S-5 as shown in FIG. 4. The D-FF 4 which is provided with a reset terminal, has an input terminal 4D connected to the power supply terminal 9 (+Vcc). The D-FF 4 is arranged to have the output signal S-4 of the D-FF 3 supplied to a clock input terminal 4a thereof and the output signal S-5 of the D-FF 2 to the reset input terminal 4b thereof. Upon receipt of these signals, the D-FF 4 produces from an output terminal 4Q, a signal S-6 a shown in FIG. 4. The signal S-6 is a drop-out detection signal.

In the embodiment described, the level of the output signal S-1 of the limiter 33 without fail becomes a high level within each period of the clock signal S-2 if the frequency of the clock signal S-2, which is generated by the clock pulse generator 6, is lower than the lowest frequency of the incoming frequency modulated signal. Therefore, if no drop-out exists in the frequency modulated signal, the T-FF 1 is reset without fail within one period of the clock signal S-2. When triggered by the clock signal, the T-FF 1 changes the level of its output 1Q from a low level to a high level. In other words, a change of the output of the T-FF 1 from a high level to a low level due to the clock signal indicates the occurrence of drop-out. This is detected by the D-FF 3 and then the D-FF 4 produces a drop-out detection signal indicating the start of a drop-out period.

Upon occurrence of drop-out, the input terminal 2D of the D-FF 2 receives a high level signal without fail. Then, at the end of the drop-out, the level of the output 2Q of the D-FF 2 changes to a low level to indicate the end of the drop-out. The end of the drop-out period is thus determined from the drop-out detection signal produced from the D-FF 4 according to the output 2Q of the D-FF 2.

In the embodiment described, each of the flip-flops are arranged to be of the fall synchronizing type and to be reset in a so-called "low-active" manner. However, a similar effect is also attainable with minor modification by replacing them with flip-flops which are of a rise synchronizing type and arranged to be reset in a so-called "high-active" manner.

Further, the output signal of the embodiment delays at least for one to two periods of the clock input signal from an actual drop-out period. However, the original signal is generally arranged to be processed through some frequency demodulation circuit, some deemphasis circuit, etc. and is thus delayed to a certain extent before it reaches a drop-out compensation circuit. Therefore, the delay caused by the drop-out detection circuit can be virtually cancelled out by selecting the frequency of the external clock pulses at a suitable value. The delay, therefore, does not present any substantial problem.

Further, although the invented system requires use of a clock signal of a fixed frequency. It requires no severe degree of precision nor much stability of the clock signal.

What is claimed is:

1. A drop-out detection circuit for a signal to be detected of varying frequency comprising:
   (a) means responsive to said signal to be detected for binary coding of said signal to be detected;
   (b) means for generating a clock signal of a predetermined frequency lower than said signal to be detected frequency;
   (c) means for detecting that the binary coded signal has assumed a predetermined state within each period of said clock signal, said detecting means including a first flip-flop connected so that an output signal thereof is inverted by said clock signal and reset by said binary coded signal; and
   (d) means for generating a drop-out detection signal on the basis of a signal produced from said detecting means.

2. A circuit according to claim 1, wherein said signal to be detected is a frequency modulated signal; and said binary coding means includes a limiter.

3. A circuit according to claim 1, wherein said detecting means further includes a second flip-flop connected to said first flip-flop to sample and hold the output signal of said first flip-flop according to said clock signal.

4. A circuit according to claim 3, wherein a start timing of a drop-out period indicated by said drop-out detection signal coincides with an inverting timing of an output signal of said second flip-flop.

5. A circuit according to claim 4, wherein said drop-out detection signal generating means includes a third flip-flop which is arranged to sample and hold said binary coded signal according to said clock signal.

6. A circuit according to claim 5, wherein an ending timing of said drop-out period indicated by said drop-out detection signal coincides with a timing at which an output signal of said third flip-flop is first inverted after said start timing.

7. A circuit according to claim 7, wherein said drop-out detection signal generating means includes a fourth flip-flop which is arranged to be triggered by the output signal of said second flip-flop and to be reset by the output signal of said third flip-flop.

8. A drop-out detection circuit for a binary signal to be detected of varying frequency comprising:
   (a) an oscillator generating a clock signal of a predetermined frequency lower than said signal to be detected frequency;
   (b) a first flip-flop connected to said oscillator and responsive to said binary signal to be detected having the output signal thereof inverted by said clock signal and reset by said binary signal to be detected; and
   (c) a second flip-flop connected to said first flip-flop to sample and hold the output signal of said first flip-flop according to said clock signal.

9. A circuit according to claim 8, further comprising a third flip-flop connected to said oscillator and responsive to said biary signal to be detected to sample and hold said binary signal to be detected, the sampling operation of said third flip-flop being performed according to said clock signal.

10. A circuit according to claim 9, further comprising a fourth flip-flop connected to said second and third flip-flops to be triggered by an output signal of said second flip-flop and to be reset by an output signal of said third flip-flop.

11. A drop-out detection apparatus for a signal to be detected comprising:
   (a) first detection means for generating a first detection signal in response to said signal to be detected for part of a period during which a drop-out of a signal to be detected is present;
   (b) second detection means for producing a second detection signal in response to said signal to be detected for part of a period during which the drop-out of the signal to be detected is not present; and
   (c) means connected to said first and second detection means for determining a drop-out period from the first detection signal produced from said first detection means and the second detection signal produced from said second detection means.

12. An apparatus according to claim 11, further comprising:
   (a) means responsive to said signal to be detected for binary coding the signal to be detected.

13. An apparatus according to claim 12, wherein said first detection means includes:
   (a) first sample holding means for sample holding a binary coded signal of said binary coding means with a predetermined clock signal.

14. An apparatus according to claim 13, wherein said second detection means includes:
   (a) a flip-flop which is reset by the binary coded output of said binary coding means and whose output is inverted by said predetermined clock signal.

15. An apparatus according to claim 14, wherein said second detection means further includes:
   (b) second sample holding means for sample holding an output of said flip-flop in accordance with said predetermined clock signal.

16. An apparatus according to claim 15, wherein said determination means includes:
   a flip-flop which is triggered by an output signal of said second sample holding means and is reset by an output of said first sample holding means.

17. An apparatus according to claim 13, wherein said first sample holding means is a D type flip-flop.

18. An apparatus according to claim 15, wherein said second sample holding means is a D type flip-flop.

* * * * *